(12) United States Patent
Lorenz et al.

(10) Patent No.: US 10,214,413 B2
(45) Date of Patent: Feb. 26, 2019

(54) MICRO-ELECTRO-MECHANICAL SYSTEM SENSOR DEVICES

(71) Applicant: Infineon Technologies AG, Neubiberg (DE)

(72) Inventors: Gunar Lorenz, Munich (DE); Nikolay Ilkov, Munich (DE); Georg Lischka, Poing (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/819,555

(22) Filed: Nov. 21, 2017

(65) Prior Publication Data

US 2018/0141802 A1 May 24, 2018

(30) Foreign Application Priority Data

Nov. 22, 2016 (DE) .................. 10 2016 122 525

(51) Int. Cl.
  *G01L 9/00* (2006.01)
  *B81B 3/00* (2006.01)
(52) U.S. Cl.
  CPC .... *B81B 3/0091* (2013.01); *B81B 2201/0257* (2013.01); *B81B 2201/0264* (2013.01); *B81B 2203/0127* (2013.01)

(58) Field of Classification Search
None
See application file for complete search history.

(56) References Cited

U.S. PATENT DOCUMENTS

| 4,602,175 A * | 7/1986 | Castagna ............. G11B 5/5521 310/13 |
| 2003/0116851 A1 | 6/2003 | Sett et al. |
| 2006/0290346 A1* | 12/2006 | Habenschaden ..... G01D 5/2013 324/207.16 |
| 2008/0176046 A1 | 7/2008 | Yamaguchi et al. |
| 2013/0255381 A1 | 10/2013 | Ricotti et al. |
| 2016/0176702 A1* | 6/2016 | Pagani ................ B81C 1/00158 257/419 |
| 2016/0219376 A1 | 7/2016 | Wang et al. |

FOREIGN PATENT DOCUMENTS

DE   102015225181 A1   6/2017

* cited by examiner

*Primary Examiner* — Calvin Y Choi
(74) *Attorney, Agent, or Firm* — Slater Matsil, LLP

(57) ABSTRACT

A MEMS sensor device includes an electrically conductive membrane and an electrically conductive closed loop structure. The closed loop structure is arranged in proximity to the membrane and is configured to reduce eddy currents in the membrane.

21 Claims, 5 Drawing Sheets

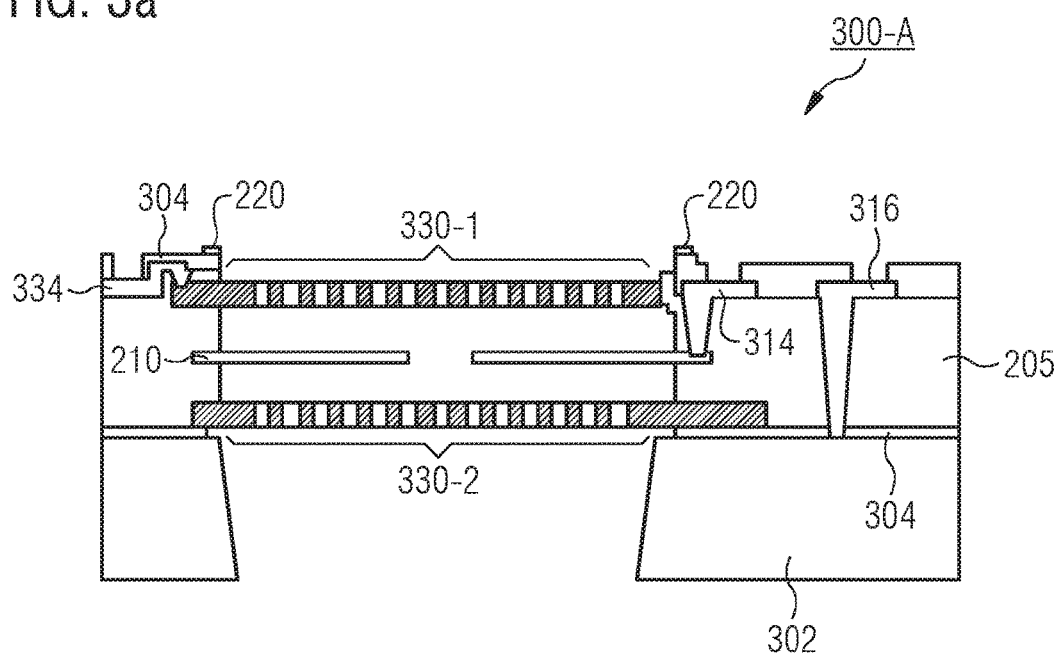
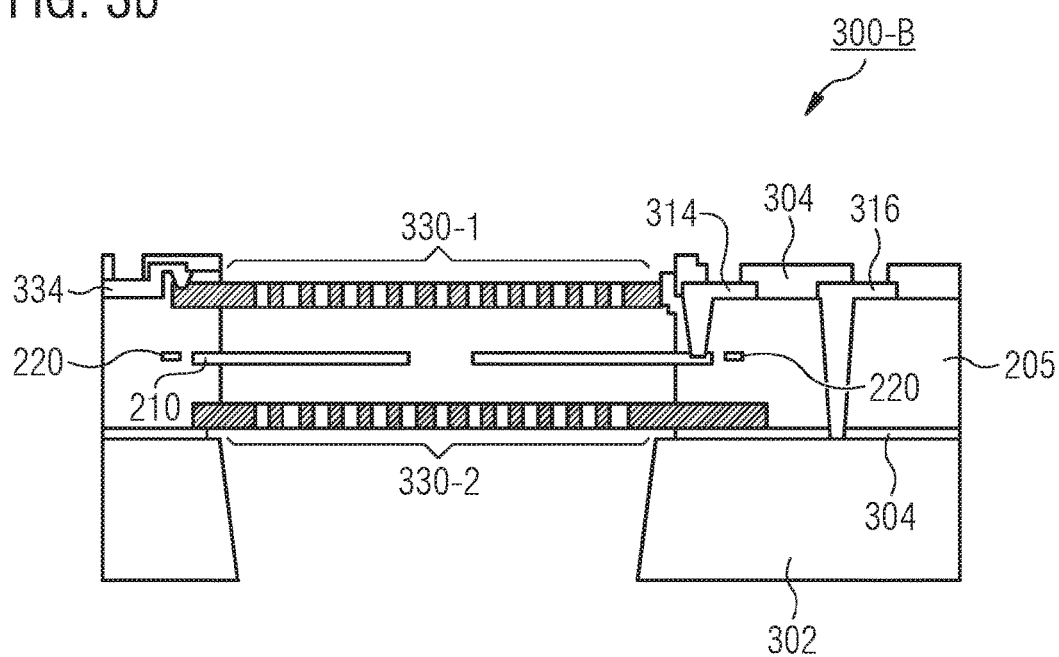

MICRO-ELECTRO-MECHANICAL SYSTEM SENSOR DEVICES

This application claims the benefit of German Application No. 102016122525.8, filed on Nov. 22, 2016, which application is hereby incorporated herein by reference in its entirety.

TECHNICAL FIELD

Examples relate to micro-electro-mechanical system (MEMS) sensor devices and in particular to structures in MEMS sensor devices for reducing eddy currents occurring in MEMS sensor devices.

BACKGROUND

MEMS sensors are employed in various applications and numerous sorts of electronic devices. In course of the miniaturization of electronic devices and their components, MEMS sensors are often placed in close proximity to other parts of an electronic device. For example, within a smartphone, a MEMS sensor implementing a microphone may be located close to an antenna of the smartphone. Electromagnetic signals at the antenna or other alternating currents within the smartphone can cause interferences that can deteriorate the functionality, reliability, and performance of the MEMS sensor. For instance, in the presence of interfering signals, the MEMS sensor does not only sense the wanted signal but also the interfering signals that superimpose and disturb the detection of the wanted signal.

Hence, there is a demand to provide concepts for improving the performance and reliability of MEMS sensors.

SUMMARY

According to a first aspect of the present disclosure, a MEMS sensor device includes an electrically conductive membrane and an electrically conductive closed loop structure. The closed loop structure is arranged in proximity to the membrane and is configured to reduce eddy currents in the membrane.

According to a second aspect of the present disclosure, another MEMS sensor device is provided. The MEMS sensor device comprises a membrane. The membrane includes regions of differing electrical conductivity configured to reduce eddy currents in the membrane.

According to another aspect of the present disclosure, yet another MEMS sensor device is provided. The MEMS sensor device includes an at least partially electrically conductive membrane and an electrically conductive closed loop structure. The closed loop structure is arranged in proximity to the membrane and is configured to reduce eddy currents in the membrane. Furthermore, the membrane comprises regions of differing electrical conductivity configured to reduce eddy currents in the membrane.

BRIEF DESCRIPTION OF THE DRAWINGS

Some examples of apparatuses and/or methods will be described in the following by way of example only, and with reference to the accompanying figures, in which:

FIG. 3a shows a schematic lateral cross section of a MEMS sensor device comprising a conductive loop structure located on top of a membrane support structure of the MEMS sensor device;

FIG. 3b shows a schematic lateral cross section of a MEMS sensor device comprising a conductive loop structure embedded in a membrane support structure of the MEMS sensor device;

DETAILED DESCRIPTION OF ILLUSTRATIVE EMBODIMENTS

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
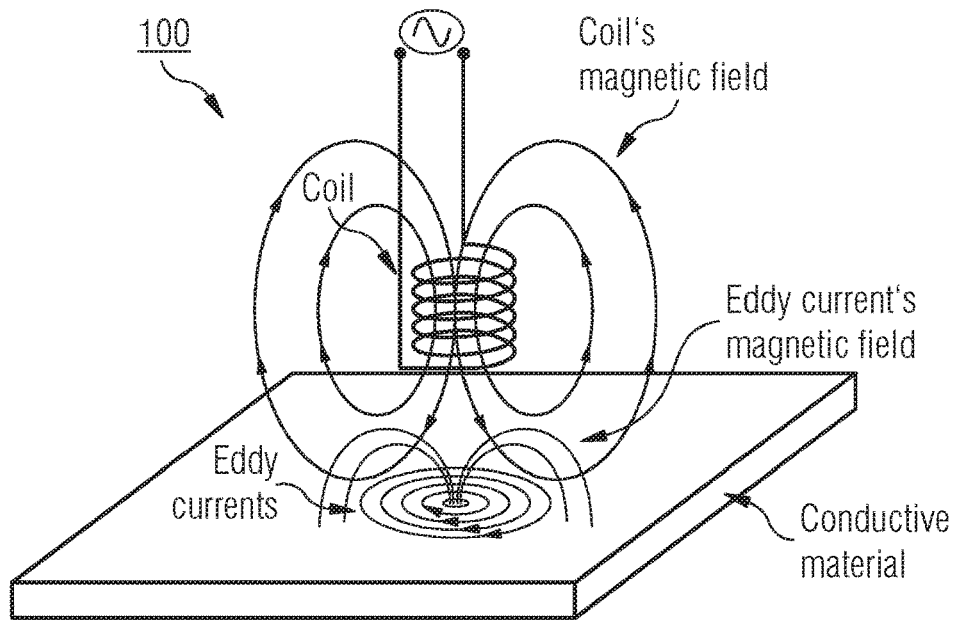
FIG. 1 illustrates induction of eddy currents within conductive material.

FIG. 1 illustrates induction 100 of eddy currents within conductive material. An alternating current flowing through a coil causes alternating magnetic fields. These alternating magnetic fields penetrate the conductive material, where they induce the eddy currents. In turn, the induced eddy currents produce themselves a magnetic field opposing the coil's magnetic fields. In an application, the coil may correspond to an antenna of a smartphone and the magnetic field to the magnetic component of an electromagnetic wave radiated by the antenna. The conductive material may be part of a MEMS sensor device, e.g., of a MEMS package or a MEMS membrane.

For example, MEMS sensor devices in mobile applications such as microphones in smartphones and tablets can be subject to intense electromagnetic high frequency radiation when placed in close proximity to a radio frequency (RF) antenna. The high power of a radiating antenna (e.g., the RF antenna) can be partially absorbed by the MEMS sensor device and can create undesired output signals known as radio frequency interference (RFI).

A form of RFI involves thermo-acoustic coupling. This form of RFI can be caused by eddy currents inside a MEMS package as illustrated in FIG. 1. The imposed magnetic field can create eddy currents in metal sheets (or conductive sheets) such as microphone membranes or back plates (of a microphone). The induced eddy currents can then cause temperature fluctuations in the exposed structures. The temperature fluctuations can be radiated into the surrounding gas inside the MEMS package. Temperature fluctuations in the gas can translate into pressure fluctuations due to thermal expansion. The temperature and the resulting pressure fluctuations can vary with the characteristic frequency of the imposed magnetic field. MEMS sensor devices may be affected by internal pressure fluctuations. For example, MEMS microphones can be sensitive to pressure fluctuations in the audible frequency band. Internal pressure fluctuations can create membrane movements which can be converted into an electrical output signal (of the MEMS microphone) which might not be distinguishable from output signals created by external pressure changes. In other words, microphones may create electrical output signals due to imposed magnetic radiation even if an external acoustic stimulus is not applied. This form of output can be seen as RFI or RF noise.

Embodiments of the present disclosure can serve to reduce and/or to avoid RFI within MEMS sensor devices.

For example, counter measures to suppress or limit RFI in MEMS sensor devices can involve electromagnetic shielding in the form of metal packages, additional ground plains in the printed circuit board (PCB) and/or parameter vias in the circumference of the PCB. For instance, measures can be based on enclosing the MEMS sensor device and its application specific integrated circuit (ASIC) in a Faraday cage in order to shield them from external radiation. Additional measures may include low pass filters on at least some (or all) electrical in-and outputs.

Nevertheless, magnetic field may still enter the MEMS package despite the shielding efforts. The corresponding magnetic field strength may still be sufficient to cause unwanted eddy current caused thermo-acoustic RFI. Suppressing all magnetic fields inside a MEMS package might a very difficult task due to the various electrical in-and outputs of the sensor system (e.g., the MEMS sensor device). Hence, embodiments of the present disclosure can propose measures to reduce the negative effects of magnetic fields inside the package such as the induction of eddy currents. The more eddy currents are reduced, the less temperature and pressure fluctuations may be present in the MEMS package. The proposed concepts and structures can be an alternative to or can be combined with methods and structures for preventing magnetic fields from entering MEMS sensor devices.

Figure 2:
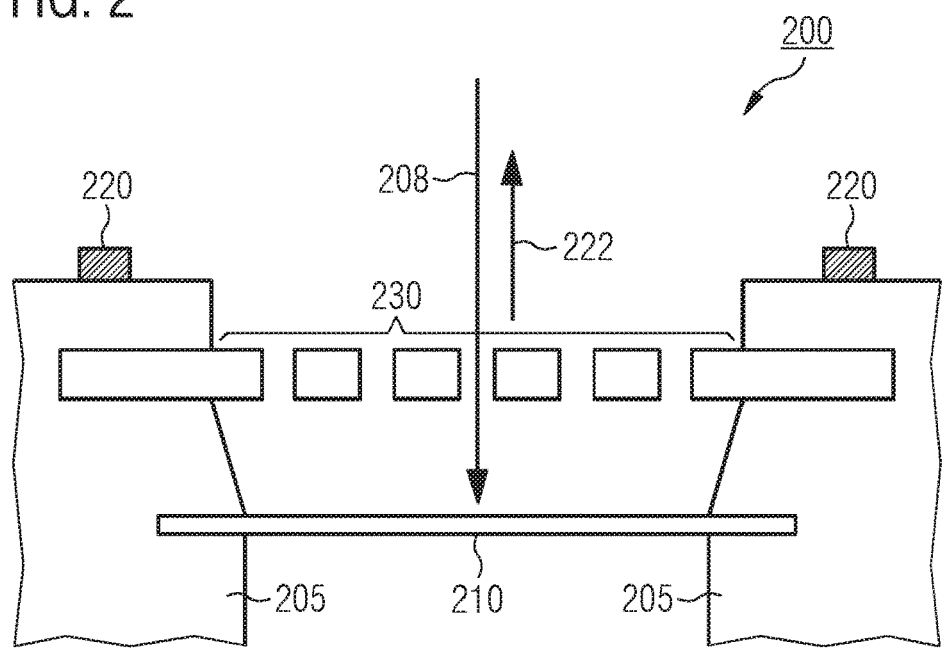
FIG. 2 shows a schematic lateral cross section of a MEMS sensor device.

According to a first aspect of the present disclosure, FIG. 2 shows a schematic lateral cross section of a micro-electro-mechanical system (MEMS) sensor device 200. The MEMS sensor device 200 comprises an electrically conductive membrane 210 and an electrically conductive closed loop structure 220. The closed loop structure 220 is arranged in proximity to the membrane 210 and is configured to reduce eddy currents in the membrane 210.

Eddy currents in the membrane 210 can be caused by an externally imposed magnetic field 208. The reduction of eddy currents due to the closed loop structure 220 can lead to a reduction of heat dissipated by the eddy currents. The less heat is dissipated, the less the gas in the MEMS sensor device 200 may be heated and thus also the less pressure variations within the MEMS sensor device 200 may be caused. Consequently, less undesired deflections of the membrane may occur that would generate interfering signals superimposing a wanted output signal of the MEMS sensor device 200. The reduction of interfering signals can improve the performance (e.g., the signal-to-interference-plus-noise ratio of the output signal of the MEMS sensor device 200) and/or the reliability of the MEMS sensor device 200.

The closed loop structure 220 can be configured to provide an opposing magnetic field 222 in response to the externally imposed magnetic field 208. The opposing magnetic field 222 can reduce an induction of eddy currents in the membrane 210 caused by the externally imposed magnetic field 208. In other words, the externally imposed magnetic field 208 can induce a current in the closed loop structure 220. According to Lenz's law this induced current can create the opposing magnetic field 222, that can be of opposite polarity to the externally imposed magnetic field 208. Due to the opposite polarity, a magnetic field strength at the membrane 210 can be reduced, so that also the induction of eddy currents in the membrane 210 can be reduced.

The closed loop structure 220 can be configured to float during operating the MEMS sensor device 200. To this end, the closed loop structure 220 can be electrically insulated from any other electrically conductive and/or current carrying structures of the MEMS sensor device 200, such as power supply lines, signal transmission lines, the membrane 210, and a back plate 230 of the MEMS sensor device 200. The closed loop structure 220 can also be electrically insulated from a ground potential of the MEMS sensor device 200. This can prevent the current induced in the closed loop structure 220 from disturbing other circuit pails and/or other functions of the MEMS sensor device 200. Additionally, this can ensure that a current in the closed loop structure 220 can only flow due to induction caused by a magnetic field (e.g., the externally imposed magnetic field 208). Magnetic fields provided by the induced current can then oppose their causing magnetic field (e.g., the externally imposed magnetic field 208).

The closed loop structure 220 can be arranged in a plane parallel to the membrane 210. As the membrane 210 can be a (substantially) planar structure (e.g., its maximal lateral extensions may be at least ten times larger than its thickness), eddy currents in the membrane are more likely to be induced by an externally imposed magnetic field 208 perpendicular to the membrane 210 than by an externally imposed magnetic field parallel to the membrane 210. To provide an opposing magnetic field 222 counteracting an externally imposed magnetic field 208 perpendicular to the membrane 210, the closed loop structure 220 may be arranged in a plane parallel to the membrane 210.

A maximal diameter of the closed loop structure 220 can be smaller than twice (or smaller than 1.5 times, or smaller than 1.1 times) a maximal diameter of the membrane 210. A smaller diameter of the closed loop structure 220 can enhance the magnitude of the opposing magnetic field 222 provided by the closed loop structure 220 in response to the externally imposed magnetic field 208. To protect a substantial share of the membrane 210 from induction of eddy currents, the maximal diameter of the closed loop structure 220 can be larger than at least 50% (or larger than 75%, or larger than 100%) of the maximal diameter of the membrane 210.

To further enhance the reduction of the externally imposed magnetic field 208 at the membrane 210, the membrane 210 and the closed loop structure 220 can be arranged (substantially) concentrically with respect to one another. For example, a geometrical center of the membrane 210 may have a maximum lateral offset from a geometrical center of the closed loop structure 220 smaller than 20% (or smaller than 10%, or smaller than 5%) of the maximal diameter of the membrane 210.

Optionally, an electrical conductivity of the closed loop structure 220 can be higher than an electrical conductivity of the membrane 210. For example, the electrical conductivity of the closed loop structure 220 can be at least twice as high (or at least three times as high, or at least five times as high, or at least ten times as high, or at least a hundred times as high) as the electrical conductivity of the membrane 210. A higher electrical conductivity of the closed loop structure 220 can facilitate the induction of a current in the closed loop structure 220 in response to the externally imposed magnetic field 208. A higher current in the closed loop structure 220 can then cause a stronger opposing magnetic field 222, so that less eddy currents may be induced in the membrane 210. To this end, the closed loop structure 220 can comprise metal (e.g., copper, tungsten, aluminum, silver, gold, and or alloys thereof), whereas the membrane 210 can comprise a corresponding metal of a lower conductivity and/or semiconductor material of a lower conductivity than the metal of the closed loop structure 220.

According to an example, the closed loop structure 220 comprises semiconductor material and the membrane comprises semiconductor material as well. An average doping concentration of the semiconductor material of the closed loop structure 220 can be at least five times larger (or at least ten times larger, or at least a hundred times larger) than an average doping concentration of the semiconductor material of the membrane. Consequently, the electrical conductivity of the closed loop structure 220 can be at least five times larger (or at least ten times larger, or at least a hundred times larger) than the electrical conductivity of the membrane 210.

The membrane 210 can be arranged between a first portion and a second portion of a semiconductor substrate of the MEMS sensor device 200 and the closed loop structure 220 can be arranged vertically above or below the membrane 210. This is shown in FIG. 2, where the membrane 210 is supported by a support structure 205 of the MEMS sensor device 200. The support structure 205 can comprise the first and the second portion of the semiconductor substrate. The first and the second portion of the semiconductor substrate can correspond to portions of the semiconductor substrate located laterally at opposite sides of the membrane 210 or above and below the membrane 210. In FIG. 2 the closed loop structure 220 is arranged vertically above the membrane and on top of the support structure 205.

For example, the closed loop structure is arranged on a surface (e.g., a front side surface) of the semiconductor substrate. This can facilitate the forming of the closed loop structure 220 during manufacturing the MEMS sensor device 200. For example, the closed loop structure 220 may comprise metal that is disposed on the front side surface of the semiconductor substrate simultaneously with other wiring structures contacting the semiconductor substrate (e.g., the membrane 210 and/or the back plate 230).

Alternatively, the closed loop structure 220 may also be embedded within the support structure 205, so that it may be arranged either vertically above or vertically below the membrane 210. In some embodiments, the MEMS sensor device comprises a plurality of closed loop structures with one or more closed loop structures being embedded in within the support structure 205 and/or arranged on top of the support structure 205.

The support structure 205 may also be formed by insulating material of a wiring layer stack located above the front side surface of a semiconductor substrate of the MEMS sensor device 200. In such an arrangement, closed loop structure(s) may be embedded within the wiring layer stack vertically above and/or vertically below the membrane 210, and/or may be located on a top wiring layer of the wiring layer stack. The wiring layer stack may comprise vertical wiring elements (e.g., vias) and lateral wiring elements (e.g., transmission lines and/or conductive planes) for contacting the semiconductor substrate.

In addition to preventing the induction of eddy currents within the membrane 210, the closed loop structure 220 can also be configured to at least reduce the induction of eddy currents within other parts of the MEMS sensor device 200 (e.g., within the back plate 230 and/or within a housing of the MEMS sensor device 200).

The back plate 230 can be a rigid and perforated conductor and can form a variable capacitor with the membrane. The membrane can be flexible. The operating principle of the MEMS sensor device can then be based on deflections of the membrane in response to pressure variations within the MEMS sensor device 200. These pressure variations can be due to acoustic pressure fluctuations (e.g., sound) and/or due to changing air pressure. For example, the MEMS sensor device 200 may be a microphone or a barometer. The capacitance between the membrane 210 and the back plate 230 can be measured and this can form the output of the MEMS sensor device 200. In other words, the MEMS sensor device can correspond to a transducer comprising the membrane 210 and the back plate 230 together with the closed loop structure 220 for the reduction of eddy currents within the membrane 210 and/or the back plate 230.

The closed loop structure 220 may comprise lateral wiring elements (comprising metal and/or doped semiconductor material) that can be laterally arranged in an arbitrary loop shape, an annular shape, an elliptical shape, semicircular shape, quadratic shape, rectangular shape and/or a polygonal shape, for example. These lateral wiring elements may correspond to portions (e.g., doping regions) of a semiconductor substrate of the MEMS sensor device 200 and/or may be located in a wiring layer stack of the MEMS sensor device 200 above the semiconductor substrate. The closed loop structure 220 may additionally comprise vertical wiring elements connecting lateral wiring elements in different wiring layers of the wiring layer stack, for example.

A maximal width of the closed loop structure 220 (e.g., the maximal difference between the outer circumference and the inner circumference of the closed loop structure 220) can be smaller than boo um (or smaller than 10 µm, or smaller than 5 µm, or smaller than 1 µm, or smaller than 500 nm). A minimal width of the closed loop structure 220 can be larger than 100 nm (or larger than 2 µm, or larger than 8 µm, or larger than 50 µm).

A maximal vertical extension of the closed loop structure 220 may be smaller than 30 µm (or smaller than 10 µm, or smaller than 5 µm, or smaller than 1 µm). A minimal vertical extension of the closed loop structure 220 may be larger than 100 nm (or larger than 2 µm, or larger than 8 µm, or larger than 15 µm).

A maximal lateral distance from the closed loop structure 220 to the membrane 210 may be smaller than 100 µm (or smaller than 50 µm, or smaller than 10 µm, or smaller than 5 µm, or smaller than 1 µm). The maximal lateral distance from the closed loop structure 220 to the membrane 210 can also be zero, e.g., a vertical projection of the closed loop structure 220 may fall onto the membrane 210. A maximal vertical distance from the closed loop structure 220 to the membrane 210 may be smaller than 100 µm (or smaller than 50 µm, or smaller than 10 µm, or smaller than 5 µm, or smaller than 1 µm). Arranging the closed loop structure 220 close to the membrane 210 can result in a stronger reduction of eddy currents with in the membrane.

Other circuit elements of the MEMS sensor device 200 (e.g., signal processing circuitry and/or power supply circuitry) may at least be partially located laterally outside the closed loop structure 220. Moreover, the closed loop structure 220 may be electrically insulated and spatially separated from a crack prevention ring of the MEMS sensor device 200. The crack prevention ring may be located at the edges of the semiconductor substrate and/or at the edges of the wiring layer stack of the MEMS sensor device and may avoid the propagation of cracks into the semiconductor substrate and/or into the wiring layer stack.

Vertical directions, vertical dimensions (e.g., depths), thicknesses of regions and/or of layers, and thicknesses of structures may, for example, be measured orthogonal to the membrane 210. Lateral directions and lateral dimensions (e.g., lengths and widths) may be measured in parallel to the membrane 210. If it is referred to a length and/or to a width of a region, of an area, of a structure and/or of a layer, the length designates the longer lateral dimension and the width designates the shorter lateral dimension of the structure and/or of the layer, for example.

The semiconductor substrate of the MEMS sensor device 200 may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer or may be comprised by a semiconductor die.

Doping of the semiconductor substrate may comprise p-doping (e.g. caused by incorporating aluminum ions or boron ions, for example) and/or n-doping (e.g. caused by incorporating nitrogen ions, phosphor ions or arsenic ions, for example).

The front side surface of the semiconductor substrate may be the surface used to implement more sophisticated and complex structures than at a back side surface of the semiconductor substrate, since the process parameters (e.g. temperature) and the handling may be limited for the back side surface, if structures are already formed at one side of the semiconductor substrate, for example.

FIG. 3a shows a MEMS sensor device 300-A. The MEMS sensor device 300-A can be similar to the MEMS sensor device 200 of FIG. 2. The MEMS sensor device 300-A is configured to detect pressure changes. For example, the MEMS sensor device 300-A can be a microphone or an air pressure sensor.

The MEMS sensor device 300-A comprises a flexible membrane 210 that is suspended at a support structure 205 (e.g., a stator of the MEMS sensor device 300-A) vertically between a first and a second rigid back plate 330-1, 330-2. The membrane 210 comprises electrically conductive material (e.g., doped polysilicon and/or a metal) and is contacted by a membrane wiring structure 314 for external connections. Moreover, the membrane 210 comprises a ventilation opening for stress alleviation in the membrane. The first and the second back plate 330-1, 330-2 are at least partially electrically conductive (e.g., comprise doped polysilicon and/or a metal) and are perforated to allow pressure changes to pass through to the membrane 210. The first back plate 330-1 is contacted by a first back plate wiring structure 334. The second back plate 330-1 can be contacted by a second, different (or same) back plate wiring structure (not shown in FIG. 3a).

The operating principle of the MEMS sensor device 300-A can be based on (small) deflections of the membrane 210 in response to pressure (e.g., acoustic and/or air pressure changes). Deflections of the membrane 210 can be detected by a change in capacitance between the membrane 210 and the back-plates 330-1, 330-2. This change in capacitance can be measured (e.g., by an additional ASIC external to the MEMS sensor device 300-A) and can form the output of the MEMS sensor device 300-A. The sensitivity of the MEMS sensor device 300-A can depend on the stiffness of the membrane 210. A less stiff membrane can deflect more in response to pressure and may thus cause a larger change in capacitance.

The support structure 205 comprises insulating material (e.g., field oxide and/or an interlayer dielectric) located on a semiconductor substrate 302 of the MEMS sensor device 300-A. A cavity extends from the front side surface of the semiconductor substrate 302 into the semiconductor substrate 302 and is located vertically below the second back plate 330-2. The cavity can serve as a resonant chamber of the MEMS sensor device 300-A. The semiconductor substrate 302 is contacted by a substrate wiring structure 316, which can, for example, serve to connect the semiconductor substrate to ground. Furthermore, an insulating layer 304 is located vertically between the semiconductor substrate 302 and the support structure 205.

An electrically conductive closed loop structure 220 is disposed on a passivation layer 304 located on a top side of the support structure 205. For example, the closed loop structure 220 comprises a metal (e.g., copper, tungsten, aluminum, silver, gold and/or an alloy thereof) and/or doped polysilicon. The closed loop structure 220 is electrically insulated from the membrane 210 and the first and the second back plate 330-1, 330-2 and can be also electrically insulated from any other electrical elements and/or structure such as supply and transmission lines of the MEMS sensor device 300-A. That is to say, the closed loop structure 220 is configured to float during operating the MEMS sensor device 300-A.

The closed loop structure 220 extends laterally in parallel to and is located vertically above the membrane 210 and the first and the second back plate 330-1, 330-2. Furthermore, the closed loop structure 220 can be substantially concentric with the membrane 210 and the first and the second back plate 330-1, 330-2.

In this way, an externally imposed magnetic field incident on the membrane 210 and/or the first and the second back plate 330-1, 330-2 may also pass through the closed loop structure 220 and induce a current in the closed loop structure 220 that flows circularly around the closed loop structure 220. The current induced in the closed loop structure 220 can then provide an opposing magnetic field in response to the externally imposed magnetic field. In other words, the magnetic field provided by the current induced in the closed loop structure can be of an opposite polarity at the membrane and/or the first and the second back plate 330-1, 330-2. Because of the opposite polarity, a total magnetic field resulting from a superposition of the externally imposed magnetic field and the opposing magnetic field can be reduced in magnitude. In turn, eddy currents in the membrane 210, the first and/or the second back plate 330-1, 330-2 induce by the externally imposed magnetic field can be reduced and/or avoided.

FIG. 3b shows another embodiment of a MEMS sensor device 300-B. The MEMS sensor device 300-B can be similar to the MEMS sensor device 300-A of FIG. 3a. In comparison to the MEMS sensor device 300-A, an electrically conductive closed loop structure 220 of the MEMS sensor device 300-B is embedded in a support structure 205 of the MEMS sensor device 300-B. In particular, the electrically conductive closed loop structure 220 is located in the same wiring layer of the MEMS sensor device 300-B as a membrane 210 of the MEMS sensor device 300-B. This can allow forming the closed loop structure 220 simultaneously with the membrane 210 during manufacturing of the MEMS sensor device 300-B and can thus reduce manufacturing efforts. The closed loop structure 220 laterally surrounds the membrane 210. Arranging the closed loop structure 220 in the same wiring layer and laterally surrounding the membrane 210 with the closed loop structure 220 may further promote the reduction of eddy currents in the membrane due to an externally imposed magnetic field. Of course, the closed loop structure 220 can also be embedded in other wiring layers of the support structure 205. For example, the support structure 205 may be a part of a wiring layer stack located on a semiconductor substrate 302 of the MEMS sensor device 300-B. This wiring layer stack may comprise multiple wiring layers, so that it is also possible to arrange the closed loop structure in a wiring layer above or below the layer of the membrane 210.

A maximal lateral distance from the closed loop structure 220 to the membrane 210 may be less than 100 µm (or smaller than 50 µm, or smaller than 10 µm, or smaller than 5 µm, or smaller than 1 µm). Locating the closed loop structure 220 laterally close to the membrane may further promote the reduction of eddy currents induced in the membrane 210.

A MEMS sensor device can also comprise a plurality of closed loop structures that may be embedded in the support structure of the membrane, on top of the support structure, and/or within the semiconductor substrate of the MEMS sensor device. A higher number of closed loop structures may further promote the reduction of eddy currents induced in the membrane and or back plates of the MEMS sensor device.

Figure 4:
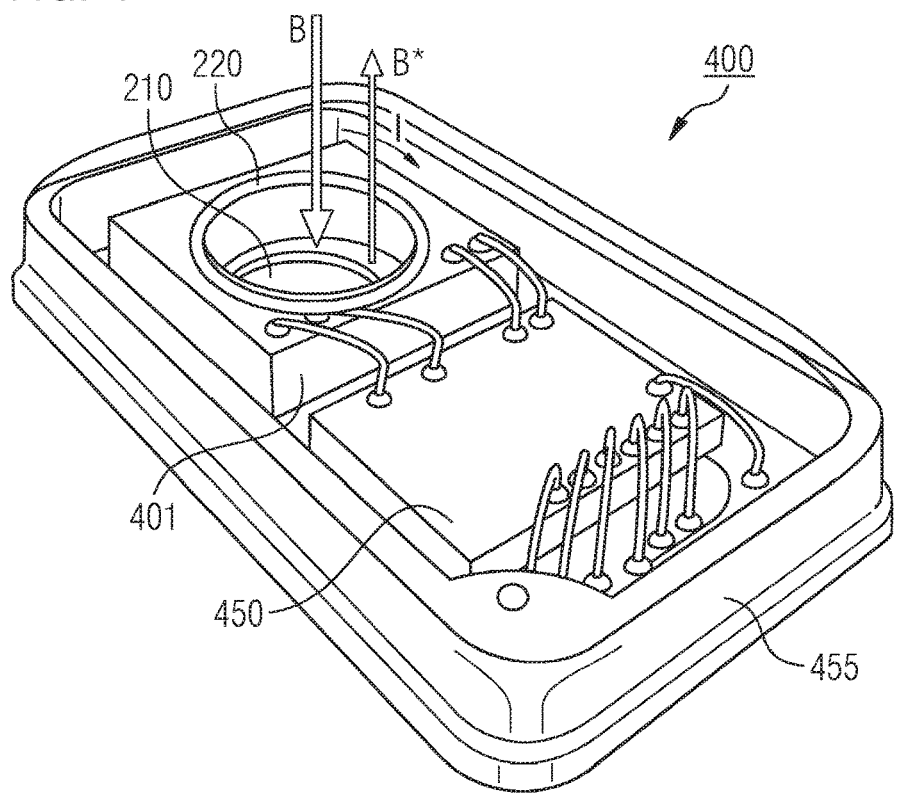
FIG. 4 shows a MEMS microphone device.

FIG. 4 shows a MEMS microphone device 400. The MEMS microphone device 400 comprises a MEMS sensor 401 and an ASIC 450. The MEMS sensor 401 can be similar to the MEMS sensor device 200 of FIG. 2 and/or to the MEMS sensors devices 300-A, 300-B of FIGS. 3a, b, respectively. The MEMS sensor 401 and the ASIC 450 are housed in a package 455 of the MEMS microphone device 400. The package 455 can comprise a sound inlet for incoming sound, so that a membrane 210 of the MEMS sensor 401 can be excited by pressure variations caused by the incoming sound. In response to the excitation of the membrane 210 the MEMS sensor 401 can generate electric signals and output these electric signals to the ASIC 450 for further signal processing, such as analog-to-digital conversion, filtering, amplification and/or equalization.

A disconnected ring 220 of conductive material (e.g., an electrically conductive closed loop structure configured to float during operating the MEMS microphone device 400) is created around or above the MEMS membrane 210. For example, the conductive ring 220 can be located on a support structure of the membrane 210 or can be embedded in the support structure. Moreover, the conductive ring 220 can be electrically insulated from the membrane 210.

A penetrating magnetic field B (e.g. an external magnetic field imposed on the MEMS microphone device 400 and, in particular, imposed on the membrane 210) can induce a current I in the conductive ring 220. The corresponding current flow can itself create a magnetic field B* which is opposed to the externally imposed magnetic field B. This opposing magnetic field B* can at least partially reduce the (penetrating) magnetic field B and therefore reduce the amount of eddy currents induced into the membrane.

For example, FIG. 4 shows an eddy current suppression ring (e.g., the conductive ring 220). Note, the membrane and the back plate(s) are not shown in the image for clarity. The conductive ring 220 can be located above or below the membrane, in a support structure surrounding the membrane and/or inside the membrane (e.g., embedded in the membrane layer by means of doping). The induced current is meant (e.g., configured) to create a counter magnetic field B* in opposite direction of the externally imposed magnetic field B.

Figure 5:
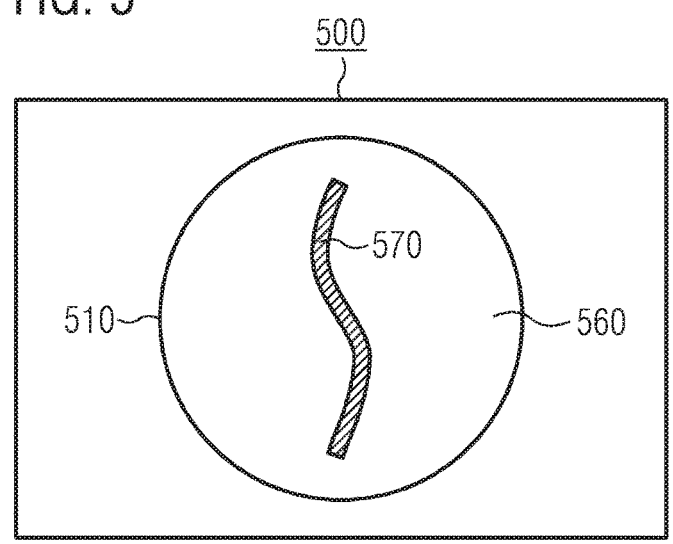
FIG. 5 shows a schematic diagram of a MEMS sensor device.

FIG. 5 shows a schematic diagram of a MEMS sensor device 500. The MEMS sensor device 500 comprises a membrane 510. The membrane 510 comprises regions 560, 570 of differing electrical conductivity configured to reduce eddy currents in the membrane.

Due to the differing electrical conductivity of the regions 560, 570 of the membrane, induction of eddy currents by an external magnetic field imposed on the membrane 510 can be reduced and/or avoided, because a current path of possible eddy currents can be intersected by electrically less conductive material within the membrane 510. By reducing eddy currents in the membrane 510, radio frequency interference affecting output signals of the MEMS sensor device 500 related to deflections of the membrane 510 may be reduced and/or prevented. This can improve the performance (e.g., the signal-to-interference-plus-noise ratio of the output signal of the MEMS sensor device 500) and/or the reliability of the MEMS sensor device 500.

To this end, the regions 560, 570 of differing electrical conductivity can be arranged in an alternating order along a circumferential direction of the membrane. For example, if the region 570 comprises less electrically conductive material, the region 570 may intersect a circular current path of possible eddy currents concentric with the membrane 510.

The regions of differing electrical conductivity can comprise at least one primary region (e.g., region 560) of a first electrical conductivity and at least one secondary region (e.g., region 570) of a second, different electrical conductivity. Furthermore, the one or more primary regions can be arranged laterally adjacent to the one or more secondary regions.

For example, the primary region(s) and the secondary region(s) can be arranged in an alternating order along the circumferential direction of the membrane 510. More alternations between primary and secondary regions may aid the reduction of eddy currents in the membrane 510. The alternations between the primary and secondary regions may break open possible eddy current paths and/or at least increase the resistance of eddy current paths. For instance, a transition between a primary region and a secondary region may occur at least at each quarter (or at least at each sixth, or at least at each eighth, or at least at each tenth) of the membrane 510 (when traversing the membrane 510 in circumferential direction).

The one or more secondary regions can extend laterally along the one or more primary regions in a radial direction of the membrane 510. In particular, this can reduce eddy current induced in paths substantially concentric with the membrane 510.

The one or more primary regions and the one or more secondary regions can extend from a front side surface of the membrane 510 to a backside surface of the membrane 510. This can prevent or reduce eddy currents in any depth within the membrane.

For further reduction of eddy currents within the membrane 510, the one or more secondary regions can extend spirally or linearly from a radially inner to a radially outer portion of the membrane 510.

In some examples, the one or more primary regions are electrically connected to an electrical interface of the MEMS sensor device 500 for relating a voltage of the one or more primary regions to movement of the membrane 510. Within the MEMS sensor device 500, the membrane 510 can be mounted with respect to a back plate of the MEMS sensor device 500 to form a variable capacitor, whose capacitance may change in course of deflections of the membrane caused by pressure variations. The one or more primary regions of the membrane may then form an electrode of this variable capacitor, while the other electrode of the variable capacitor may be formed by the back plate. The one or more secondary regions of the membrane may thus be of a lower electrical conductivity then the primary region(s) and may serve the reduction of eddy currents within the membrane.

According to some examples, the first electrical conductivity of the at least one primary region is at least two times higher (or at least five times higher, or at least ten times higher, or at least a fifty times higher, or at least a hundred times higher) than the second electrical conductivity of the at least one secondary region. A higher difference between the electrical conductivity of the primary region(s) and the secondary region(s) (e.g., a higher resistivity of the secondary regions) may more efficiently create resistive obstacles in paths of possible eddy currents within the membrane 510. This can reduce the amount of eddy currents induced by an externally imposed magnetic field within the membrane 510.

For example, the one or more primary regions and the one or more secondary regions are located within semiconductor material (e.g., comprise crystalline silicon or polysilicon) of the membrane 510 and comprise differing average doping concentrations. An average doping concentration of the one or more primary regions can be at least twice as high (or at least three times as high, or at least five times as high, or at least ten times as high, or at least a hundred times as high) than an average doping concentration of the one or more secondary regions.

Additionally or alternatively, the at least one primary region and the at least one secondary region may comprise different conductivity types. For example, the at least one primary region may be n-doped and the at least one secondary region may be p-doped. This can create a pn-junction (or pn-junctions) between the primary region(s) and the secondary region(s). The pn-junctions may then block or reduce the flow of possible eddy currents within the membrane 510.

Alternatively, the at least one primary region may consists of electrically conductive material (e.g., metal or doped semiconductor material) and the at least one secondary region may comprise solid electrically insulating material (e.g., silicon dioxide and/or silicon nitride). Solid electrically insulating material introduced into the membrane 510 can block or reduce the flow of possible eddy currents within the membrane 510. To this end, the secondary region(s) may be formed as trenches lined with insulating material and extending into the membrane 510. These trenches may extend vertically through the membrane 510.

Figure 6A:
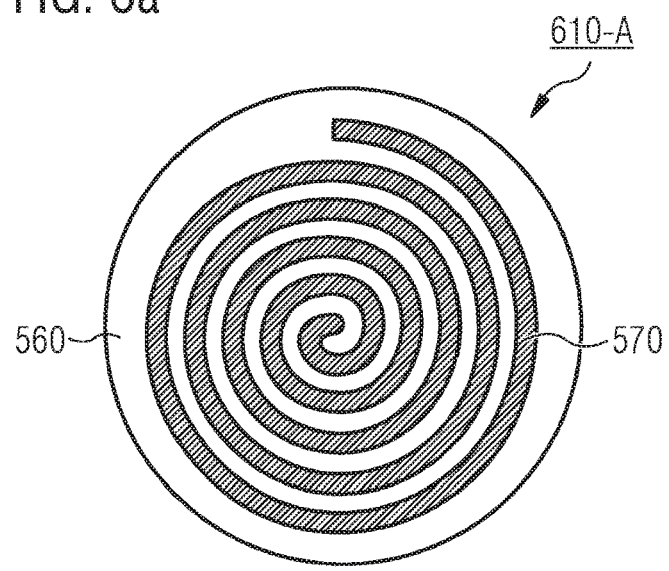
FIG. 6a shows a schematic top view of membrane of a MEMS sensor device comprising a secondary region with a spiral shape.

FIG. 6a shows a schematic top view of a membrane 610-A of a MEMS sensor device. The membrane 610-A may be similar to the membrane 510 of FIG. 5.

The membrane 610-A comprises a primary region 560 of a first electrical conductivity and a secondary region 570 of a second, different electrical conductivity. The primary region 560 is arranged laterally adjacent to the secondary region 570. The secondary region 570 extends spirally from a radially inner portion of the membrane 610-A (e.g., the center of the membrane 610-A) to a radially outer portion of the membrane (e.g., towards or to the circumference of the membrane 610-A). For example, a maximal lateral extension of the secondary region is larger than 50% (or larger than 75%, or larger than 90%, or larger than 95%) of a maximal lateral extension (e.g., the diameter) of the membrane 610-A.

The primary region 560 may comprise a base material of the membrane 610-A and may comprise more than 50% (or more than 75%, or more than 90%, or more than 95%) of a total volume of the membrane 610-A. If the primary region 560 (e.g., the base material) comprises electrically conductive material, the secondary region 570 may comprise solid electrically insulating material. Alternatively, if the primary region 560 comprises solid electrically insulating material, the secondary region 570 may comprise electrically conductive material. For example, the electrically conductive material may comprise doped crystalline silicon, doped polysilicon and/or metal, the electrically insulating material may comprise silicon oxide, silicon nitride and/or intrinsic semiconducting material. In another alternative, both the primary region 560 and the secondary region 570 comprise electrically conductive material of different conductivity. Different conductivities can, for example, be realized by different doping concentrations in semiconductor material of the primary and secondary region 560, 570.

Due to the different conductivities of the primary and the secondary region 560, 570 and the secondary region 570 extending spirally in lateral direction within the membrane 610-A, induction of eddy currents in the membrane 610-A can be reduced, because a current path of possible eddy currents can be intersected by electrically insulating or electrically less conductive material within the membrane 610-A.

Figure 6B:
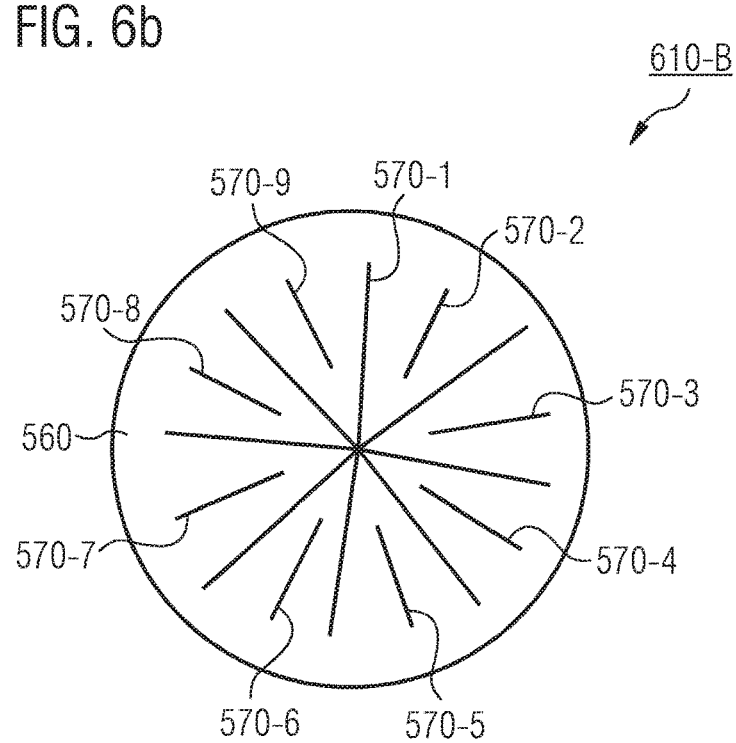
FIG. 6b shows a schematic top view of another membrane of a MEMS sensor device comprising a plurality of secondary regions extending laterally in a radial direction of the membrane.

FIG. 6b shows a schematic top view of another membrane 610-B of a MEMS sensor device. The membrane 610-B may be similar to the membrane 510 of FIG. 5 and/or to the membrane 610-A of FIG. 6a.

In contrast to the membrane 610-A, the membrane 610-B comprises a plurality of secondary regions 570-1, 570-2, 570-3, 570-4, 570-5, 570-6, 570-7, 570-8, 570-9. Each of the plurality of secondary regions extends linearly from a radially inner portion of the membrane 610-B to a radially outer portion of the membrane 610-B (e.g., towards or to the circumference of the membrane 610-B). That is to say, the secondary regions extend along radii of the membrane 610-B in lateral direction.

The secondary regions are laterally surrounded by a primary region 560 of the membrane 610-B. Due to the electrical conductivity of the secondary regions 570-1 to 570-9 differing from that of the primary region 560, possible eddy current paths in the membrane 610-B can be intersected by electrically insulating or electrically less conductive material. For example, the electrical conductivity of the secondary regions 570-1 to 570-9 may be lower than the electrical conductivity of the primary region 560 (or vice versa). This can reduce and/or suppress eddy currents within the membrane 610-B, when an external magnetic field penetrates the membrane 610-B.

The embodiments of FIGS. 6a-b can include selective membrane doping. MEMS structures such as microphone membranes can be ion doped during the fabrication process. Doping can be used to control mechanical stress (e.g., within the membrane) and/or to alter the electrical properties of the material (e.g., of the membrane). Doping can have a particular impact on the specific resistivity of MEMS materials such as polysilicon. A selective doping can be used to create high and low ohmic regions on the membrane as seen in FIGS. 6a-b. For example, the secondary regions may indicate areas of higher or lower membrane doping. The high and low ohmic regions (e.g., the primary and secondary regions) can be created as lines or spirals in a way to suppress or at least to reduce eddy currents.

Figure 7:
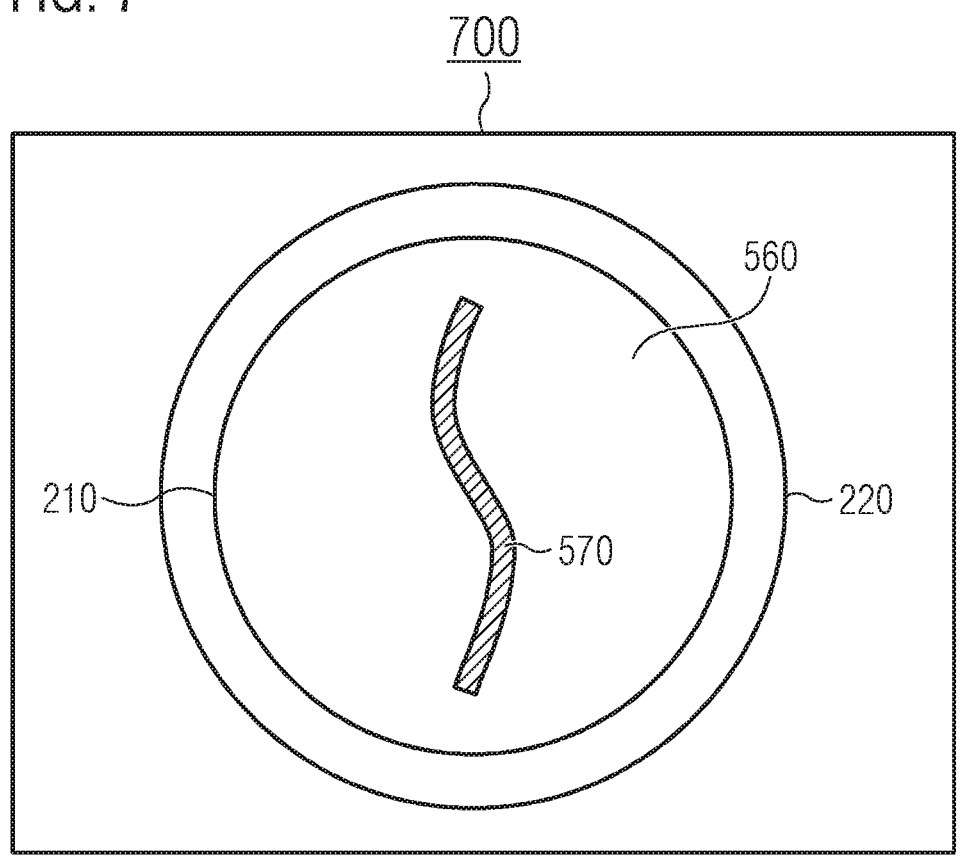
FIG. 7 shows a schematic diagram of a MEMS sensor device comprising a conductive loop structure and a membrane with regions of differing electrical conductivity configured to reduce eddy currents in the membrane.

FIG. 7 shows a schematic diagram of a MEMS sensor device 700 comprising an at least partially electrically conductive membrane 210 and an electrically conductive closed loop structure 220. The closed loop structure 220 is arranged in proximity to the membrane 210 and is configured to reduce eddy currents in the membrane 210. Furthermore, the membrane 210 comprises regions 560, 570 of differing electrical conductivity configured to reduce eddy currents in the membrane 210.

That is to say, the embodiments explained in the context of FIGS. 1-4 may be combined with the embodiments explained in context with FIGS. 5-6b. By providing several means to the MEMS sensor device 700 for reducing eddy currents (e.g., the closed loop structure 220 and the regions 560, 570 of differing electrical conductivity within the membrane 210) the reduction of eddy currents in the membrane 210 and other parts of the MEMS sensor device 700 (e.g., a back plate and/or a package of the MEMS sensor device 700) can be enhanced. Thus the performance and/or the reliability of the MEMS sensor device 700 may be further improved.

Moreover, some embodiments of the present disclosure relate to methods for radio frequency interference (RFI) reduction by eddy currents and/or target the root cause of MEMS sensor RFI in mobile consumer applications. Other apparatuses relate to membranes with slits and/or with ferromagnetic coatings for the reduction of eddy currents in MEMS sensor devices.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A micro-electro-mechanical system sensor device comprising:
   an electrically conductive membrane; and
   an electrically conductive closed loop structure arranged in proximity to the membrane and configured to reduce eddy currents in the membrane, wherein an electrical conductivity of the closed loop structure is higher than an electrical conductivity of the membrane.

2. The micro-electro-mechanical system sensor device of claim 1, wherein the closed loop structure is configured to provide an opposing magnetic field in response to an externally imposed magnetic field, wherein the opposing magnetic field reduces an induction of eddy currents in the membrane caused by the externally imposed magnetic field.

3. The micro-electro-mechanical system sensor device of claim 1, wherein the closed loop structure is configured to float during operating the micro-electro-mechanical system sensor device.

4. The micro-electro-mechanical system sensor device of claim 1, wherein the closed loop structure is arranged in a plane parallel to the membrane.

5. The micro-electro-mechanical system sensor device of claim 1, wherein a maximal diameter of the closed loop structure is smaller than twice a maximal diameter of the membrane.

6. The micro-electro-mechanical system sensor device of claim 1, wherein the membrane and the closed loop structure are arranged concentrically with respect to one another.

7. The micro-electro-mechanical system sensor device of claim 1, wherein the closed loop structure comprises semiconductor material and wherein the membrane comprises semiconductor material, wherein an average doping concentration of the semiconductor material of the closed loop structure is at least five times larger than an average doping concentration of the semiconductor material of the membrane.

8. The micro-electro-mechanical system sensor device of claim 1, wherein the membrane is arranged between a first portion and a second portion of a semiconductor substrate of the micro-electro-mechanical system sensor device, wherein the closed loop structure is arranged vertically above or below the membrane.

9. The micro-electro-mechanical system sensor device of claim 8, wherein the closed loop structure is arranged on a surface of the semiconductor substrate.

10. A micro-electro-mechanical system sensor device comprising:
a membrane comprising regions of differing electrical conductivity configured to reduce eddy currents in the membrane, wherein the regions of differing electrical conductivity comprise one or more primary regions of a first electrical conductivity and one or more secondary regions of a second, different electrical conductivity, wherein the one or more primary regions are arranged laterally adjacent to the one or more secondary regions.

11. The micro-electro-mechanical system sensor device of claim 10, wherein the regions of differing electrical conductivity are arranged in an alternating order along a circumferential direction of the membrane.

12. The micro-electro-mechanical system sensor device of claim 10, wherein the one or more secondary regions extend laterally along the one or more primary regions in a radial direction of the membrane.

13. The micro-electro-mechanical system sensor device of claim 10, wherein the one or more primary regions and the one or more secondary regions extend from a front side surface of the membrane to a backside surface of the membrane.

14. The micro-electro-mechanical system sensor device of claim 10, wherein the one or more secondary regions extend spirally or linearly from a radially inner to a radially outer portion of the membrane.

15. The micro-electro-mechanical system sensor device of claim 10, wherein the one or more primary regions are electrically connected to an electrical interface of the micro-electro-mechanical system sensor device for relating a voltage of the one or more primary regions to movement of the membrane.

16. The micro-electro-mechanical system sensor device of claim 10, wherein the first electrical conductivity is at least five times higher than the second, different electrical conductivity.

17. The micro-electro-mechanical system sensor device of claim 10, wherein the one or more primary regions and the one or more secondary regions are located within semiconductor material of the membrane and comprise differing average doping concentrations.

18. The micro-electro-mechanical system sensor device of claim 10, wherein the one or more primary regions comprise electrically conductive material, and wherein the one or more secondary regions comprise solid electrically insulating material.

19. The micro-electro-mechanical system sensor device of claim 10, further comprising an electrically conductive closed loop structure arranged in proximity to the membrane and configured to reduce eddy currents in the membrane.

20. The micro-electro-mechanical system sensor device of claim 1, wherein the membrane comprises regions of differing electrical conductivity configured to reduce eddy currents in the membrane.

21. A micro-electro-mechanical system sensor device comprising:
an electrically conductive membrane; and
an electrically conductive closed loop structure arranged in proximity to the membrane and configured to reduce eddy currents in the membrane, wherein the closed loop structure comprises semiconductor material and wherein the membrane comprises semiconductor material, wherein an average doping concentration of the semiconductor material of the closed loop structure is at least five times larger than an average doping concentration of the semiconductor material of the membrane.

* * * * *